(12) United States Patent
Imafuji (10) Patent No.: US 10,438,883 B2
(45) Date of Patent: Oct. 8, 2019

(54) WIRING BOARD AND SEMICONDUCTOR DEVICE

(71) Applicant: SHINKO ELECTRIC INDUSTRIES CO., LTD., Nagano (JP)

(72) Inventor: Kei Imafuji, Nagano (JP)

(73) Assignee: SHINKO ELECTRIC INDUSTRIES CO., LTD., Nagano (JP)

( * ) Notice: Subject to any disclaimer, the term of this patent is extended or adjusted under 35 U.S.C. 154(b) by 0 days.

(21) Appl. No.: 15/819,310

(22) Filed: Nov. 21, 2017

(65) Prior Publication Data

US 2018/0182701 A1  Jun. 28, 2018

(30) Foreign Application Priority Data

Dec. 26, 2016 (JP) ................. 2016-251599

(51) Int. Cl.
*H01L 23/00* (2006.01)
*H01L 23/498* (2006.01)
(Continued)

(52) U.S. Cl.
CPC .... *H01L 23/49838* (2013.01); *H01L 23/3157* (2013.01); *H01L 24/14* (2013.01); *H01L 24/17* (2013.01); *H01L 23/49866* (2013.01); *H01L 24/16* (2013.01); *H01L 24/32* (2013.01); *H01L 24/73* (2013.01); *H01L 24/81* (2013.01);
(Continued)

(58) Field of Classification Search
CPC ... H01L 23/49838; H01L 24/17; H01L 24/14; H01L 23/3157; H01L 23/49866; H01L 2224/81464; H01L 24/32; H01L 24/73; H01L 24/81; H01L 2224/83385; H01L 2224/81439; H01L 2224/81444; H01L 2224/81193; H01L 2224/32225; H01L 2224/16238; H01L 2224/16225; H01L 2224/1413; H01L 2224/13101; H01L 24/92; H01L 24/83; H01L 2924/1436; H01L 2224/73204; H01L 2224/92125; H01L 25/50; H01L 2924/1431;
(Continued)

(56) References Cited

U.S. PATENT DOCUMENTS

2002/0020555 A1* 2/2002 Daido .................. H05K 3/0052
174/261
2005/0104220 A1* 5/2005 Tsuchiya ................. H01L 24/81
257/774

(Continued)

FOREIGN PATENT DOCUMENTS

JP   2014-183085      9/2014
JP   2014183085 A  *  9/2014

*Primary Examiner* — Evren Seven
(74) *Attorney, Agent, or Firm* — IPUSA, PLLC (57) ABSTRACT

A wiring board includes an insulator layer having a top surface, and a plurality of pads arranged in a pad arrangement region on the top surface of the insulator layer. The pad arrangement region includes a first region in which a first plurality of pads among the plurality of pads are arranged at a first density, and a second region in which a second plurality of pads among the plurality of pads are arranged at a second density lower than the first density. At least one dummy pad is arranged juxtaposed to at least one of the second plurality of pads in the second region of the pad arrangement region.

21 Claims, 7 Drawing Sheets

(51) Int. Cl.
 *H01L 23/31* (2006.01)
 *H01L 25/18* (2006.01)
 *H01L 25/065* (2006.01)
 *H01L 25/00* (2006.01)
(52) U.S. Cl.
 CPC .............. *H01L 24/83* (2013.01); *H01L 24/92* (2013.01); *H01L 25/0655* (2013.01); *H01L 25/18* (2013.01); *H01L 25/50* (2013.01); *H01L 2224/13101* (2013.01); *H01L 2224/1413* (2013.01); *H01L 2224/16225* (2013.01); *H01L 2224/16227* (2013.01); *H01L 2224/16238* (2013.01); *H01L 2224/32225* (2013.01); *H01L 2224/73204* (2013.01); *H01L 2224/81193* (2013.01); *H01L 2224/81439* (2013.01); *H01L 2224/81444* (2013.01); *H01L 2224/81464* (2013.01); *H01L 2224/83385* (2013.01); *H01L 2224/92125* (2013.01); *H01L 2924/1431* (2013.01); *H01L 2924/1434* (2013.01); *H01L 2924/1436* (2013.01)

(58) Field of Classification Search
 CPC . H01L 24/16; H01L 2924/1434; H01L 25/18; H01L 2224/16227; H01L 25/0655
 See application file for complete search history.

(56) References Cited

U.S. PATENT DOCUMENTS

| | | | | |
|---|---|---|---|---|
| 2007/0253276 | A1* | 11/2007 | Ochi | ................... G02F 1/13452 |
| 2013/0272648 | A1* | 10/2013 | Terada | ..................... G02B 6/43 |
| | | | | 385/14 |
| 2015/0371965 | A1* | 12/2015 | Hu | ......................... H01L 21/78 |
| | | | | 257/737 |

* cited by examiner

WIRING BOARD AND SEMICONDUCTOR DEVICE

CROSS-REFERENCE TO RELATED APPLICATION

This application is based upon and claims the benefit of priority of the prior Japanese Patent Application No. 2016-251599, filed on Dec. 26, 2016, the entire contents of which are incorporated herein by reference.

FIELD

Certain aspects of the embodiments discussed herein are related to wiring boards and semiconductor devices.

BACKGROUND

A multi-chip module can provide a high performance at a low cost, by mounting different types of semiconductor devices on a circuit board. A known circuit board for such a multi-chip module is mounted with semiconductor chips of logic circuits, memories such as DRAM (Dynamic Random Access Memory) and SRAM (Static Random Access Memory), or the like. These semiconductor chips may employ a design in which electrodes are arranged at a high density in one region and the electrodes are arranged at a low density in another region. In order to cope with the design of such semiconductor chips, a high-density region in which pads for connecting to the electrodes of the semiconductor chips are arranged at a high density, and a low-density region in which pads for connecting to the electrodes of the semiconductor chips are arranged at a low density, coexist on a single wiring board, as proposed in Japanese Laid-Open Patent Publication No. 2014-183085, for example.

In addition, because high reliability is required of the proposed circuit board, the pads are surface-treated. Generally, the surface treatment forms a plated layer on the pads by electroless plating that is unlikely to be subjected to design restrictions.

In a case in which the plated layer is formed by the electroless plating on the pads that are arranged at a constant density (or constant pitch) on the wiring board, it is possible to perform a uniform plating on all of the pads by adjusting plating conditions.

However, when the high-density region in which the pads for connecting to the electrodes of the semiconductor chips are arranged at the high density, and the low-density region in which the pads for connecting to the electrodes of the semiconductor chips are arranged at the low density, coexist on the single wiring board, deposition by the plating is difficult with respect to the pads in the low-density region if the plating conditions are adjusted for the high-density region. On the other hand, the plated layer may protrude between adjacent pads and cause a short-circuit in the high-density region if the plating conditions are adjusted for the low-density region.

In other words, it is difficult to adjust the plating conditions to become optimum for both the high-density region and the low-density region.

SUMMARY

Accordingly, it is an object in one aspect of the embodiments to provide a wiring board and a semiconductor device, which enable uniform plating on pads arranged at different densities.

According to one aspect of the embodiments, a wiring board includes an insulator layer having a top surface; and a plurality of pads arranged in a pad arrangement region on the top surface of the insulator layer, wherein the pad arrangement region includes a first region in which a first plurality of pads among the plurality of pads are arranged at a first density, and a second region in which a second plurality of pads among the plurality of pads are arranged at a second density lower than the first density, and wherein at least one dummy pad is arranged juxtaposed to at least one of the second plurality of pads in the second region of the pad arrangement region.

The object and advantages of the embodiments will be realized and attained by means of the elements and combinations particularly pointed out in the claims.

It is to be understood that both the foregoing general description and the following detailed description are exemplary and explanatory and not restrictive of the invention, as claimed.

DESCRIPTION OF EMBODIMENTS

Preferred embodiments of the present invention will be described with reference to the accompanying drawings. In the drawings, those parts that are the same are designated by the same reference numerals, and a repeated description of the same parts may be omitted.

A description will now be given of the wiring board and the semiconductor device in each embodiment according to the present invention.

First Embodiment

Figure 1A:
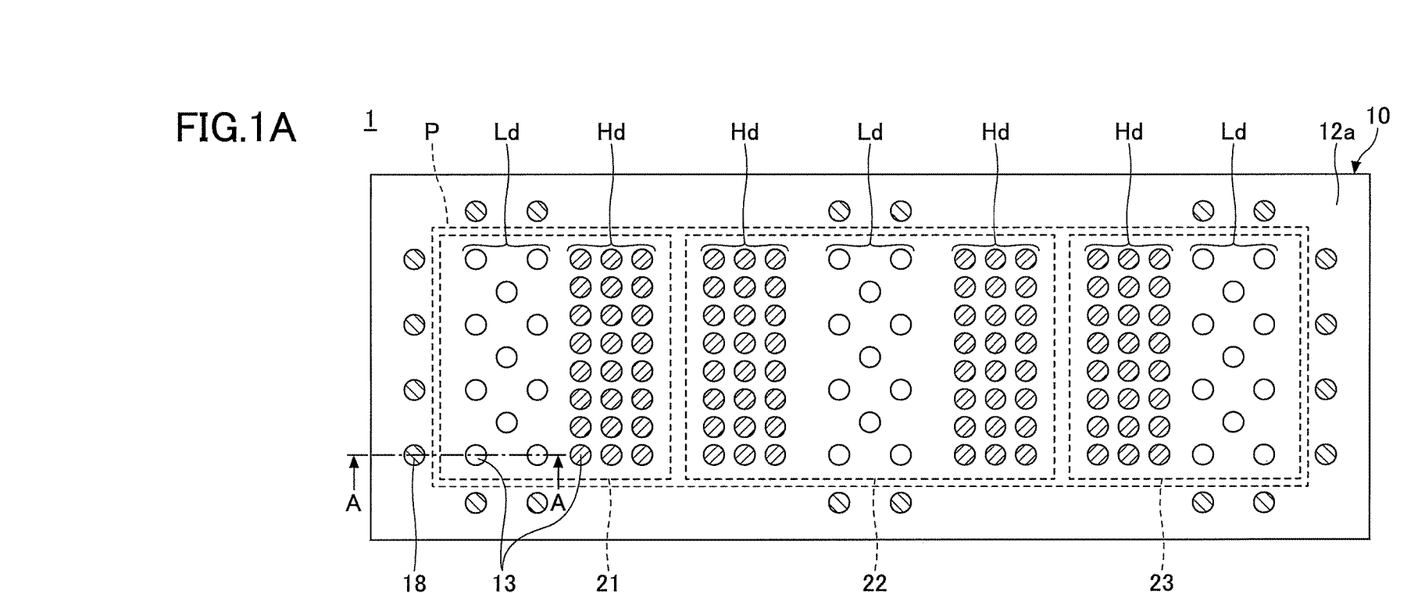
FIGS. 1A and 1B are diagrams illustrating an example of a semiconductor device in a first embodiment.
Figure 1B:
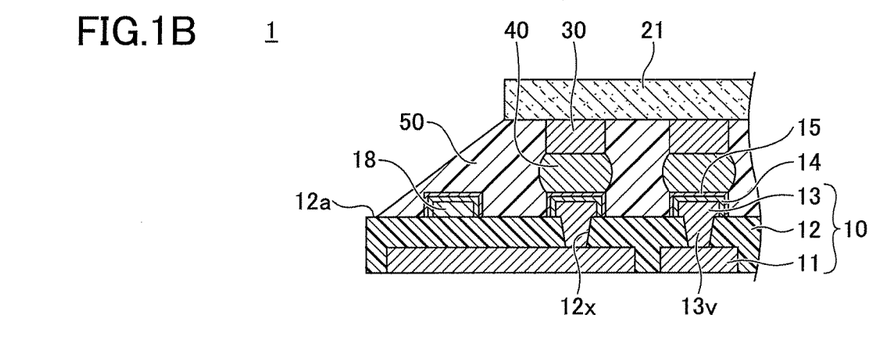

FIGS. 1A and 1B are diagrams illustrating an example of a semiconductor device in a first embodiment. FIG. 1A illustrates a plan view of the semiconductor device, and FIG. 1B illustrates an enlarged cross sectional view of a part of the semiconductor device along a line A-A in FIG. 1A. However, FIG. 1A mainly illustrates an arrangement of pads, and an illustration of constituent elements illustrated in FIG. 1B is omitted in FIG. 1A.

As illustrated in FIGS. 1A and 1B, a semiconductor device 1 includes a wiring board 10, semiconductor chips 21, 22, and 23, bumps 40, and an underfill resin 50. The circuit board 10 includes a wiring layer 11, an insulator layer 12, a plurality of pads 13, and a plurality of dummy pads 18.

In this embodiment, it is assumed for the sake of convenience that an upper side (or first side) of the semiconductor device 1 is the side (or end) provided with the semiconductor chips 21 through 23, and that a lower side (or second side)

of the semiconductor device 1, opposite to the upper side (or first side), is the side (or end) of the semiconductor device 1 provided with the wiring layer 11. In addition, it is assumed for the sake of convenience that an upper surface (or first surface) of each part of the semiconductor chips 21 through 23 is the surface of each part of the semiconductor chips 21 through 23 facing the semiconductor chips 21 through 23, and that a lower surface (or second surface) of each part of the semiconductor chips 21 through 23 is the surface of each part of the semiconductor chips 21 through 23 facing the wiring layer 11. Of course, the semiconductor device 1 may be used in a state in which the semiconductor device 1 illustrated in FIG. 1B is arranged upside down, or is arranged at an arbitrary inclination angle. Further, the plan view of each part of the semiconductor device 1 illustrated in FIG. 1A refers to a plan view viewed in a direction perpendicular to a top surface 12a of the insulator layer 12, that is, viewed in a normal direction from above the top surface 12a of the insulator layer 12. Similarly, a planar shape of each part of the semiconductor device 1 illustrated in FIG. 1A refers to a shape in the plan view viewed in the direction perpendicular to the top surface 12a of the insulator layer 12, that is, viewed in the normal direction from above the top surface 12a of the insulator layer 12.

In the wiring board 10, the wiring layer 11 is covered by the insulator layer 12. The wiring layer 11 is made of a conductive material such as copper (Cu) or the like, for example. The wiring layer 11 may have a thickness of approximately 1 μm to approximately 20 μm, for example.

The insulator layer 12 that covers the wiring layer 11 may be formed by a build-up process, as an interlayer insulator of a multilayer wiring. Accordingly, another insulator layer or another wiring layer may be stacked below the wiring layer 12, as an underlayer. In this case, a suitable via hole may be provided in the other insulator layer, to electrically connect two or more wiring layers through the via hole.

The insulator layer 12 may be made of epoxy insulating resins, polyimide insulating resins, or the like that are non-photosensitive thermosetting resins, for example. Alternatively, the insulator layer 12 may be made of photosensitive epoxy insulating resins, acrylic insulating resins, or the like. The insulator layer 12 may include a reinforcing material such as glass fabrics or the like. In addition, the insulator layer 12 may include a reinforcing material such as silica ($SiO_2$) fillers or the like. The insulator layer 12 may have a thickness of approximately 3 μm to approximately 30 μm, for example.

The plurality of pads 13 form external connection terminals for electrically connecting to the semiconductor chips 21 through 23, and contribute to electrical connection in the semiconductor device 1. The plurality of pads 13 are arranged in a pad arrangement region P on the top surface 12a of the insulator layer 12. The pad arrangement region P includes a first region (or high-density region) $H_d$ in which a first plurality of pads 13 among the plurality of pads 13 are arranged at a first density (or high density), and a second region (or low-density region) $L_d$ in which a second plurality of pads 13 among the plurality of pads 13 are arranged at a second density (or low density) lower than the first density $H_d$.

In other words, a pitch (or interval) at which the second plurality of pads 13 are arranged inside the second region $L_d$ is wider than a pitch (or interval) at which the first plurality of pads 13 are arranged inside the first region $H_d$. The first plurality of pads 13 in the first region $H_d$ are mainly used for transferring signals, and are arranged at a pitch of approximately 50 μm, for example. On the other hand, the second plurality of pads 13 in the second region $L_d$ are mainly used for electrically connecting to a power supply or ground, and are arranged at a pitch of approximately 100 μm, for example.

For the sake of convenience, FIG. 1A illustrates the first plurality of pads 13 in the first region $H_d$ by rightwardly ascending hatchings, the second plurality of pads 13 in the second region $L_d$ by white blanks, and the plurality of dummy pads 18 by rightwardly descending hatchings.

The planar shape of each pad 13 may be a circular shape having a diameter of approximately 20 μm to approximately 30 μm, for example. However, each pad 13 may have a planar shape other than the circular shape, such as an oval shape, a rectangular shape, or the like. Each pad 13 may have a thickness of approximately 1 μm to approximately 20 μm, for example.

Each pad 13 may electrically connect to the wiring layer 11 through a via wiring 13v filling a via hole 12x that penetrates the insulator layer 12 and exposes a top surface of the wiring layer 11. The pads 13 and the corresponding via wirings 13v are famed integrally, and the pads 13 and the via wirings 13v may be made of a conductive material such as copper (Cu) or the like, for example. The pads 13 and the via wirings 31v may be formed by a semi-additive process, for example. Wiring patterns may be provided in the same layer (or level) as the pads 13.

Surfaces of the pads 13, that is, a top surface and side surfaces of the pads 13, are covered by a nickel-plated layer 14. The nickel-plated layer 14 may have a thickness of approximately 0.05 μm to approximately 10 μm, for example. The nickel-plated layer 14 may be formed by electroless plating, for example. The nickel-plated layer 14 may be made solely of nickel (Ni), or may be made of an alloy of nickel (Ni) and phosphorous (P), boron (B), or the like, such as Ni—P, Ni—B, or the like, for example.

Surfaces of the nickel-plated layer 14, that is, a top surface and side surfaces of the nickel-plated layer 14, are covered by a metal layer 15. The metal layer 15 may be formed by an gold (Au) layer, a silver (Ag) layer, a palladium (Pd) layer, a Pd/Au multilayer structure in which a Pd layer and an Au layer are stacked in this order, or the like, for example. The metal layer 15 may have a thickness of approximately 0.01 μm to approximately 1 μm, for example. The metal layer 15 may be formed by electroless plating, for example.

An adhesion layer (or bonding layer, not illustrated) may be provided as an underlayer to each of the pads 13, the nickel-plated layer 14, and the metal layer 15. In other words, the adhesion layer may be provided on the top surface 12a of the insulator layer 12, and the pads 13, the nickel-plated layer 14, and the metal layer 15 may be formed on the adhesion layer. The adhesion layer may be made of any one of a Cu layer, a titanium (Ti) layer, a chromium (Cr) layer, a Ni layer, a stacked structure including 2 or more stacked layers selected from the Cu layer, the Ti layer, the Cr layer, and the Ni layer, for example. In addition, the adhesion layer may be made of an alloy layer that is made of an alloy including 2 or more materials selected from a group consisting of Cu, Ti, Cr, Ni, or the like, for example. The adhesion layer may have a thickness of approximately 0.01 μm to approximately 2 μm, for example. The adhesion layer may be formed by electroless plating, sputtering, or the like.

The plurality of dummy pads 18 are arranged outside the second region $L_d$ of the pad arrangement region P, juxtaposed to the pads 13 located at an outermost peripheral part of the second region $L_d$ in the plan view. The plurality of dummy pads 18 do not form external connection terminals for electrically connecting to the semiconductor chips 21 through 23, and do not contribute to electrical connection in the semiconductor device 1. In this example, the dummy pads 18 are electrically insulated from the semiconductor chips 21 through 23. The number of dummy pads 18 provided on the semiconductor device 1 is not limited to a particular number, and it is sufficient to provide at least one dummy pad 18 with respect to only the second region $L_d$ of the pad arrangement region P. In this case, at least one dummy pad 18 may be arranged outside the second region $L_d$ of the pad arrangement region P, juxtaposed to at least one of the pads 13 located at the outermost peripheral part of the second region $L_d$.

In this example, the plurality of dummy pads 18 are provided with respect to only the second region $L_d$ of the pad arrangement region P, and may be arranged juxtaposed to the pads 13 located at the outermost peripheral part of the second region $L_d$ in the plan view. This means that the plurality of dummy pads 18 are not provided with respect to the first region $H_d$ of the pad arrangement region P, and no dummy pads 18 are arranged juxtaposed to the pads 13 located at an outermost peripheral part of the first region $H_d$ in the plan view. However, the plurality of dummy pads 18 provided with respect to only the second region $L_d$ of the pad arrangement region P, may be arranged inside the second region $L_d$, juxtaposed to the pads 13 located at the outermost peripheral part of the second region $L_d$ in the plan view. In this case, the dummy pads 18 arranged inside the second region $L_d$, may be located in a region on the outer side or the inner side of the pads 13 located at the outermost peripheral part of the second region $L_d$.

In this example, the planar shape of the dummy pads 18 is the same as the planar shape of the pads 13, and is a circular shape. In addition, a diameter of the dummy pads 18 is approximately the same as the diameter of the pads 13. However, the dummy pads 18 may have a planar shape different from the planar shape of the pads 13, and may have a planar shape other than the circular shape, such as an oval shape, a rectangular shape, or the like. In addition, the dummy pads 18 may have a planar shape that is a circular shape having a diameter different from the diameter of the pads 13 having the circular planar shape.

A distance between one dummy pad 18 and one of the pads 13 located at the outermost peripheral part of the second region $L_d$ and nearest to the one dummy pad 18 (that is, the distance between a pair of dummy pad 18 and pad 13 nearest to each other) is approximately the same as a distance between two mutually adjacent pads 13 inside the second region $L_d$.

Surfaces of the dummy pads 18, that is, a top surface and side surfaces of the dummy pads 18, may be covered by a nickel-plated layer 14, similarly as in the case of the pads 13. Surfaces of the nickel-plated layer 14, that is, the top surface and the side surfaces of the nickel-plated layer 14, may be covered by a metal layer 15. Because the dummy pads 18 do not contribute to the electrical connection in the semiconductor device 1, dummy pads 18 not formed with the nickel-plated layer 14 nor the metal layer 15, and dummy pads 18 only partially formed with at least one of the nickel-plated layer 14 and the metal layer 15, may coexist with the dummy pads 18 formed with the nickel-plated layer 14 and the metal layer 15.

The semiconductor chips 21 through 23 are flip-chip bonded onto the wiring board 10. Each electrode 30 of the semiconductor chips 21 through 23 is electrically connected to a corresponding one of the pads 13 through the bump 40 that is formed by solder or the like. The semiconductor chips 21 and 23 are memory ICs (Integrated Circuits), for example, and the semiconductor chip 22 is a logic IC, for example. The underfill resin 50 fills spaces between the wiring board 10 and the semiconductor chips 21 through 23.

Each of the dummy pads 18 is preferably completely covered or partially covered by the underfill resin 50. Because the dummy pads 18 are not electrically connected to other wiring patterns or the like, the dummy pads 18 may separate from the top surface 12a of the insulator layer 12. However, the dummy pads 18 can be prevented from separating from the top surface 12a of the insulator layer 12 by completely covering or partially covering each of the dummy pads by the underfill resin 50.

Figure 2A:
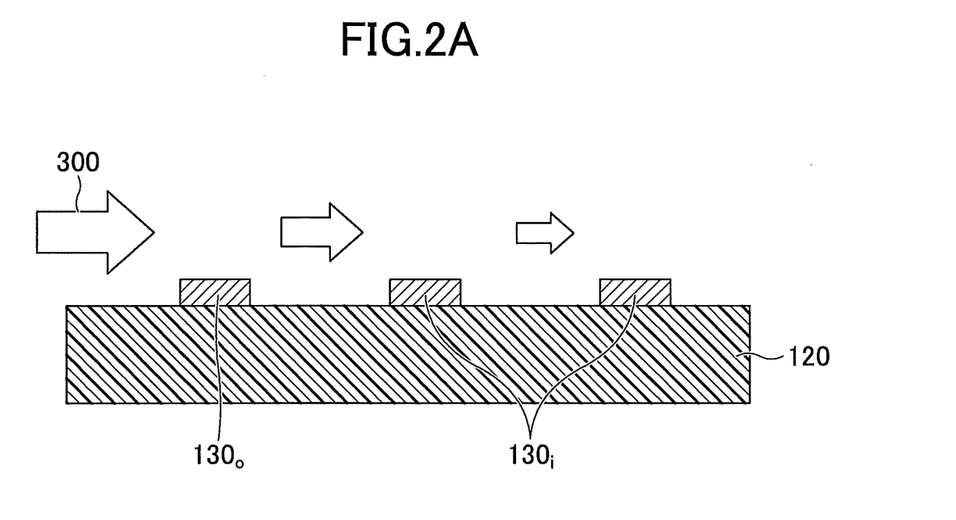
FIGS. 2A and 2B are diagrams for explaining reasons why nickel deposition reaction is obstructed.
Figure 2B:
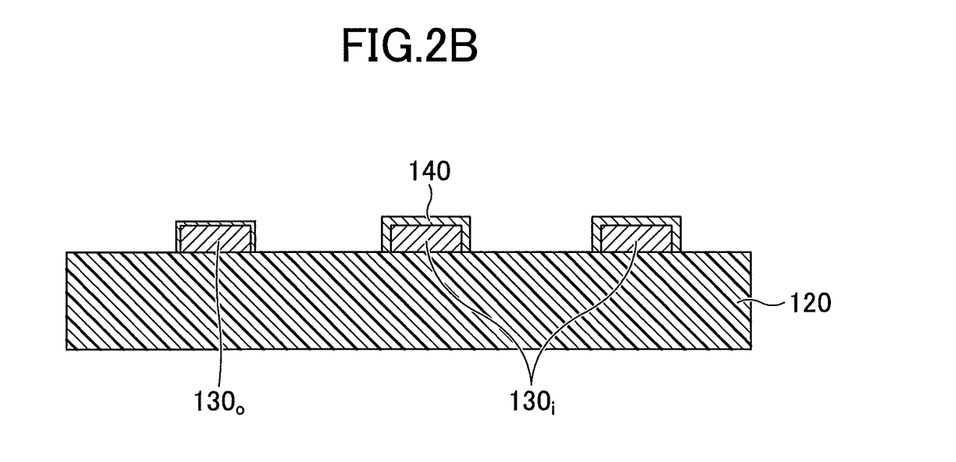

Next, a description will be given of reasons for arranging the dummy pads 18 outside the second region $L_d$ of the pad arrangement region P, juxtaposed to the pads 13 located at the outermost peripheral part of the second region $L_d$ in the plan view. FIGS. 2A and 2B are diagrams for explaining reasons why nickel deposition reaction is obstructed. It is assumed in FIGS. 2A and 2B that pads $130_o$ and $130_i$ formed on an insulator layer 120 are nickel-plated by electroless plating. The pads $130_o$ indicates a pad located at the outermost peripheral part of the second region $L_d$ in the plan view, and the pads $130_i$ indicate pads located on the inner side of the outermost peripheral part of the second region $L_d$ in the plan view.

In FIG. 2A, a nickel-plating solution is added with a reaction inhibitor to prevent unwanted decomposition within the nickel-plating solution and prevent unwanted deposition of the nickel-plating with respect to a surface or part other than the surface or part that is to be nickel-plated. A concentration of the reaction inhibitor is limited to an extent such that the nickel reaction does not deteriorate, however, effects of the reaction inhibitor may become locally conspicuous. In FIG. 2A, a magnitude of the effects of the reaction inhibitor is schematically illustrated by a size of arrows 300, such that the larger the size of the arrow 300 the larger the magnitude of the effects of the reaction inhibitor. As illustrated in FIG. 2A, the pad $130_o$ located at the outermost peripheral part of the second region $L_d$ does not have other pads or the like located externally to the left side of the pad $130_o$ in FIG. 2A. For this reason, the pad $130_o$ is greatly affected by a flow rate of the plating solution, and the effects of the reaction inhibitor are locally most conspicuous in a vicinity of the pad $130_o$ located at the outermost peripheral part of the second region $L_d$. The effects of the reaction inhibitor become smaller towards the inner side of the outermost peripheral part of the second region $L_d$. In other words, the pad $130_o$ located at the outermost peripheral part of the second region $L_d$ is in a state in which the nickel deposition reaction is easily obstructed due to the effects of the reaction inhibitor.

In addition, as illustrated in FIG. 2B, an abnormal deposition of the nickel-plating occurs at the pad $130_o$ located at the outermost peripheral part of the second region $L_d$. The abnormal deposition of the nickel-plating refers to a state in which no nickel-plated layer 140 is deposited on the pad, or a thickness of the nickel-plated layer 140 does not reach a designed thickness value in a region on the pad.

On the other hand, when the dummy pads 18 are arranged outside the second region $L_d$, juxtaposed to the pads 13 located at the outermost peripheral part of the second region $L_d$ as illustrated in FIG. 1A, a local agitating speed of the reaction inhibitor around the pads 13 located at the outermost peripheral part of the second region $L_d$ decreases, to reduce the effects of the reaction inhibitor. Hence, the provision of the dummy pads 18 can reduce the abnormal deposition of the nickel-plating.

In a case in which the density of the pads 13 in the pad arrangement region P is constant, the dummy pads 18 may be omitted. In this case, the nickel-plated layer 14 can be uniformly formed on all of the pads 13 arranged in the pad arrangement region P, by suitably adjusting conditions such as a plating temperature, a concentration of a reducer, the reaction inhibitor, the agitating speed of the reaction inhibitor, or the like. The nickel-plated layer 14 that is uniformly formed on the pads 13 refers to the nickel-plated layer 14 that is formed to a thickness within a designed thickness value range of the nickel-plated layer 14.

On the other hand, in a case in which the pad arrangement region P includes the first region $H_d$ and the second region $L_d$ in which the densities of the pads 13 are mutually different and no dummy pads 18 are provided, it is difficult to uniformly form the nickel-plated layer 14 on all of the pads 13 arranged in the pad arrangement region P, by merely adjusting the conditions described above.

In this case, under a condition in which the abnormal deposition of the nickel-plating can be improved on the pads 13 located at the outermost peripheral part of the second region $L_d$, excessive deposition of the nickel-plating may occur on the pads 13 in the first region $H_d$, to cause a short-circuit (or short-circuit abnormality) between the mutually adjacent pads 13 of the first region $H_d$. In other words, there is a problem in that it is difficult to suitably adjust the conditions described above in order to simultaneously improve the abnormal deposition of the nickel-plating on the pads 13 located at the outermost peripheral part of the second region $L_d$, and avoid the short-circuit abnormality from occurring between the mutually adjacent pads 13 in the first region $H_d$.

The problem described above can be solved by arranging the dummy pads 18 outside the second region $L_d$, juxtaposed to the pads 13 located at the outermost peripheral part of the second region $L_d$. In other words, it is possible to improve the abnormal deposition of the nickel-plating on the pads 13 located at the outermost peripheral part of the second region $L_d$, under a condition in which the short-circuit abnormality can be avoided from occurring between the mutually adjacent pads 13 in the first region $H_d$.

Figure 3A:
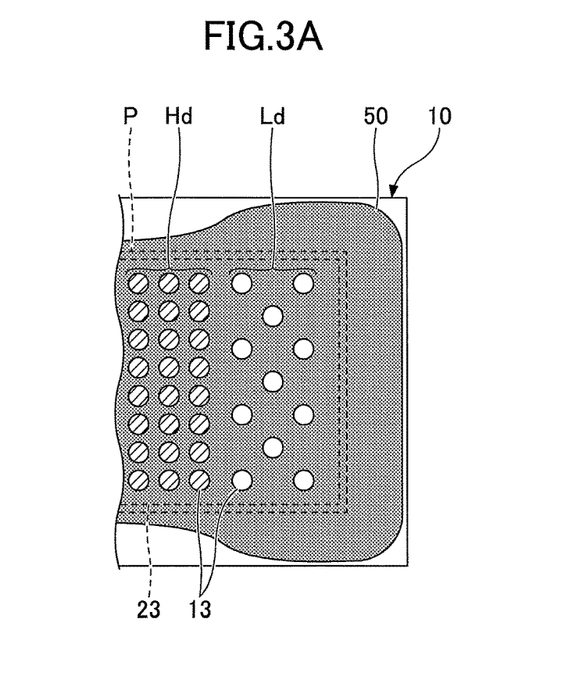
FIGS. 3A and 3B are diagrams for explaining one of effects of arranging dummy pads.
Figure 3B:
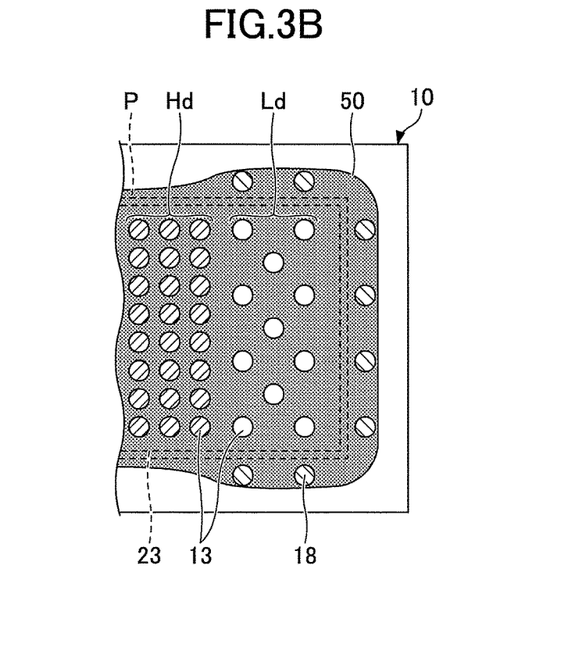

In addition, it is also possible to obtain the following effects by arranging the dummy pads 18 outside the second region $L_d$, juxtaposed to the pads 13 located at the outermost peripheral part of the second region $L_d$. FIGS. 3A and 3B are diagrams for explaining one of effects of arranging the dummy pads.

That is, in a case in which the dummy pads 18 are not provided as illustrated in FIG. 3A, a wettability (or wetting and spreading properties) of the underfill resin 50 is better in the second region $L_d$ when compared to the first region $H_d$. Consequently, the underfill resin 50 may flow out of the outermost peripheral part of the second region $L_d$.

On the other hand, in the case in which the dummy pads 18 are arranged outside the second region $L_d$, juxtaposed to the pads 13 located at the outermost peripheral part of the second region $L_d$, it is possible to limit the underfill resin 50 from flowing out of the outermost peripheral part of the second region $L_d$.

Modification of First Embodiment

Figure 4A:
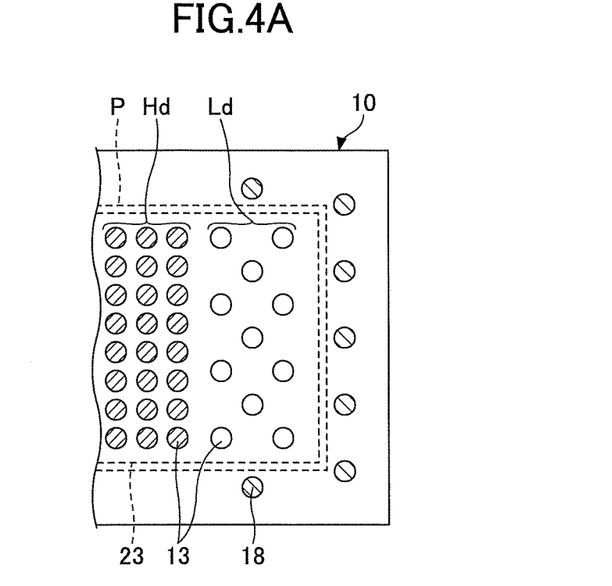
FIGS. 4A and 4B are diagrams illustrating another example of an arrangement of the dummy pads.
Figure 4B:
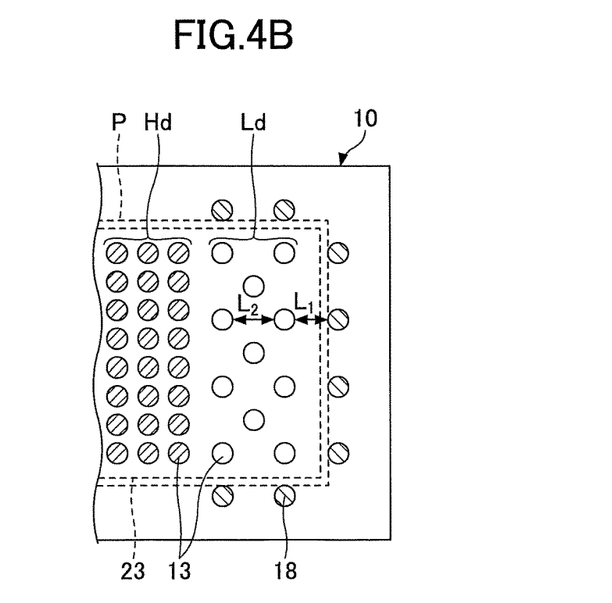

A modification of the first embodiment provides a variation of the arrangement of the dummy pads. In this modification of the first embodiment, those parts that are the same as the first embodiment are designated by the same reference numerals, and a repeated description of the same parts may be omitted. FIGS. 4A and 4B are diagrams illustrating another example of an arrangement of the dummy pads.

As illustrated in FIG. 4A, the dummy pads 18 are arranged outside the second region $L_d$, juxtaposed to the pads 13 located at the outermost peripheral part of the second region $L_d$, in the plan view, and the dummy pads 18 and the pads 13 located at the outermost peripheral part of the second region $L_d$ are arranged in a staggered pattern. For example, a part of the pads 13 located at the outermost peripheral part of the second region $L_d$ may be arranged in the staggered pattern with the dummy pads 18 as illustrated in FIG. 4A, and a remainder part of the pads 13 located at the outer peripheral part of the second region $L_d$ may be arranged side-by-side to the dummy pads 18 as illustrated in FIG. 4B. In this case, it is possible to satisfactorily control the flow of the underfill resin 50.

As illustrated in FIG. 4B, a distance $L_1$ between one dummy pad 18 and one of the pads 13 located at the outermost peripheral part of the second region $L_d$ and nearest to the one dummy pad 18 is shorter than a distance $L_2$ between two mutually adjacent pads 13 inside the second region $L_d$. In this case, the local agitating speed of the reaction inhibitor around the pads 13 located at the outermost peripheral part of the second region $L_d$ decreases, to reduce the effects of the reaction inhibitor.

Figure 5A:
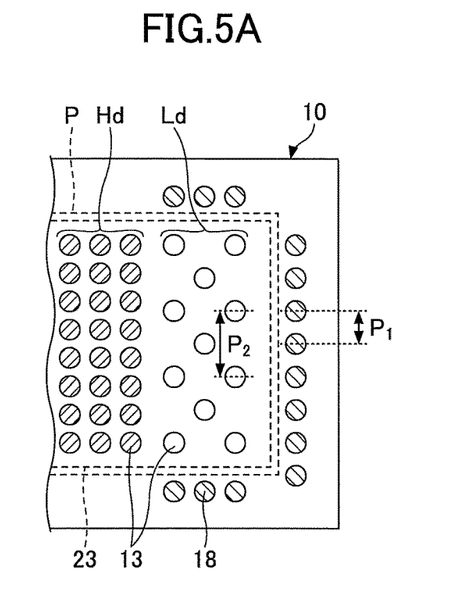
FIGS. 5A and 5B are diagrams illustrating still another example of the arrangement of the dummy pads.
Figure 5B:
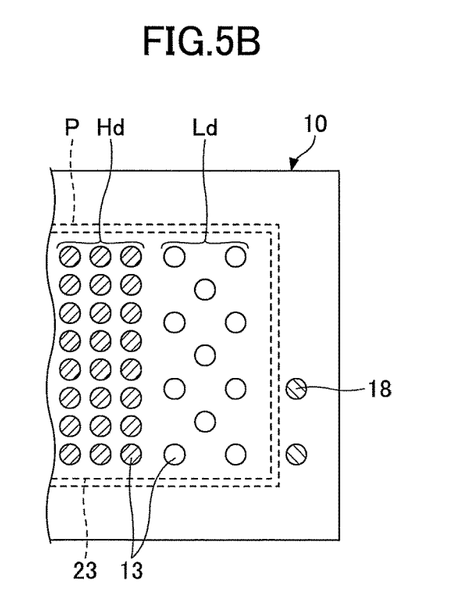

FIGS. 5A and 5B are diagrams illustrating still another example of the arrangement of the dummy pads.

As illustrated in FIG. 5A, a pitch $P_1$ of the dummy pads 18 may be shorter than a pitch $P_2$ of the mutually adjacent pads 13 inside the second region $L_d$.

In addition, as illustrated in FIG. 5B, the dummy pads 18 may be arranged juxtaposed to only a part of the pads 13 located at the outermost peripheral part of the second region $L_d$.

Figure 6A:
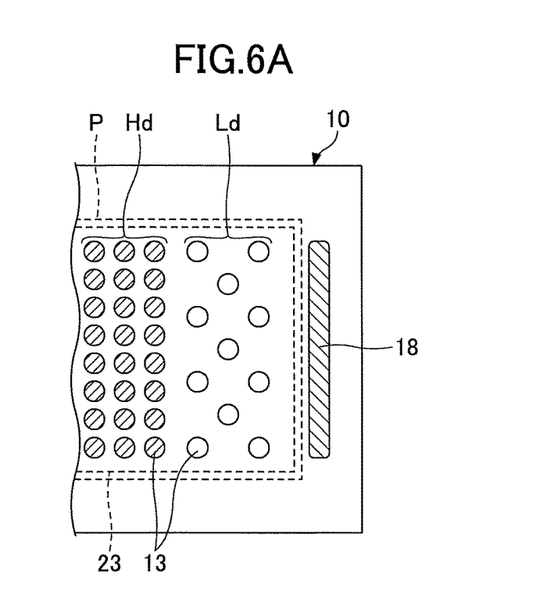
FIGS. 6A and 6B are diagrams illustrating a further example of the arrangement of the dummy pads.
Figure 6B:
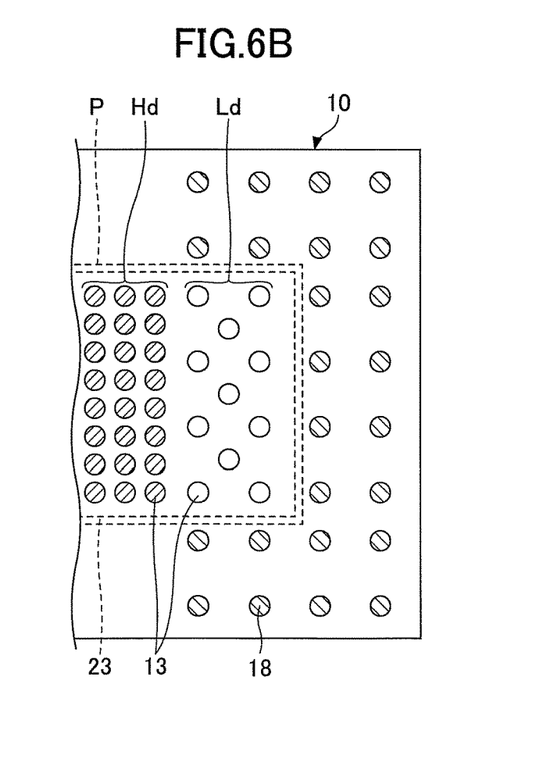

FIGS. 6A and 6B are diagrams illustrating a further example of the arrangement of the dummy pads.

As illustrated in FIG. 6A, the dummy pad 18 is not limited to the circular shape, and the dummy pad 18 may have a pattern or shape that is elongated along one side of the second region $L_d$, juxtaposed to the pads 13 located at the outermost peripheral part along this one side of the second region $L_d$, in the plan view. In this case, the elongated pattern of the dummy pad 18 is not limited to a linear shape, and may include a curved part.

As illustrated in FIG. 6B, a plurality of columns of the dummy pads 18 may be arranged outside the second region $L_d$, juxtaposed to the pads 13 located at the outermost peripheral part of the second region $L_d$, in the plan view. In this case, the number of columns of the dummy pads 18 is not limited to 2 columns, and may be 3 or more columns.

Second Embodiment

Figure 7A:
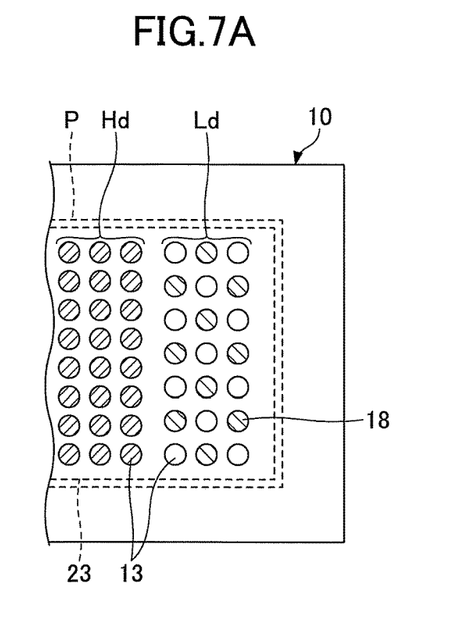
FIGS. 7A and 7B are diagrams illustrating another example of the arrangement of the dummy pads.
Figure 7B:
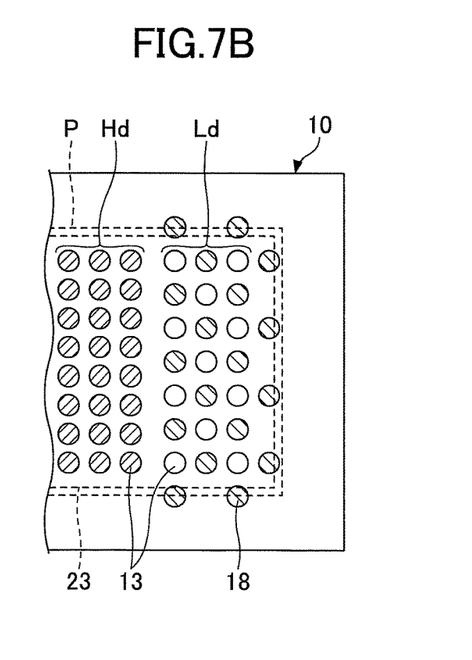

In a second embodiment, the arrangement of the dummy pads 18 is different from the arrangement of the dummy pads 18 of the first embodiment described above. In this second embodiment, those parts that are the same as the first embodiment are designated by the same reference numerals, and a repeated description of the same parts may be omitted. FIGS. 7A and 7B are diagrams illustrating another example of the arrangement of the dummy pads.

As illustrated in FIG. 7A, the dummy pads 18 may be arranged between the pads 13 that are located at the outermost peripheral part of the second region $L_d$, or between the pads 13 that are located on the inner side of the outermost peripheral part of the second region $L_d$, in the plan view.

Alternatively, the dummy pads 18 may be arranged between the pads 13 inside the second region $L_d$.

For example, in a case in which a distance between mutually adjacent pads 13 arranged in the second region $L_d$ is long (that is, the pitch of the pads 13 in the second region $L_d$ is wide), even the pads 13 located on the inner side of the outermost peripheral part of the second region $L_d$ are greatly affected by the flow rate of the nickel-plating solution, and the nickel deposition reaction is easily obstructed, similarly as in the case of the first embodiment.

However, even in such a case, it is possible to reduce the effects of the flow rate of the nickel-plating solution, by arranging the dummy pads 18 between the pads 13 that are located at the outermost peripheral part of the second region $L_d$, and/or between the pads 13 that are located on the inner side of the outermost peripheral part of the second region $L_d$. For this reason, the abnormal deposition of the nickel-plating can be improved even on the pads 13 located on the inner side of the outermost peripheral part of the second region $L_d$.

In addition, as illustrated in FIG. 7B, the dummy pads 18 may further be arranged on the outside the second region $L_d$, juxtaposed to the pads 13 located at the outermost peripheral part of the second region $L_d$, by combining the arrangement of the dummy pads 18 of the second embodiment illustrated in FIG. 7A with the arrangement of the dummy pads 18 of the first embodiment. In this case, it is possible to obtain effects similar to the effects obtainable in the first embodiment for the pads 13 located at the outermost peripheral part of the second region $L_d$.

According to each of the embodiments described above, it is possible to enable a uniform plating on pads arranged at different densities. For example, a uniform plating can be performed with respect to both the pads in the high-density region and the pads in the low-density region.

For example, the present invention is not limited to the embodiment in which the semiconductor chips are flip-chip bonded on the wiring board. The present invention is similarly applicable to a case in which the semiconductor chips are mounted on the wiring board by other bonding techniques, such as wire-bonding or the like.

Further, at least two of the first embodiment, the modification of the first embodiment, and the second embodiment may be appropriately combined. For example, the pads 13 arranged at the outermost peripheral part of the second region $L_d$ and the dummy pads 18 may be arranged in a staggered pattern, and in addition, the distance between the pad 13 located at the outermost peripheral part of the second region $L_d$ and the nearest dummy pad 18 may be shorter than the distance between the mutually adjacent pads 13 inside the second region $L_d$.

In each of the embodiments described above, a juxtaposing direction in which at least one dummy pad 18 is arranged juxtaposed to at least one pad 13 in the second region $L_d$ of the pad arrangement region P is not limited to a particular direction. In other words, the juxtaposing direction is not limited to the particular direction, such as a horizontal direction and a vertical direction in the plan view, for example, and may be an arbitrary direction. Further, the pad 13 to which the dummy pad 18 is juxtaposed is not limited to the pad 13 nearest to the dummy pad 18.

Although the embodiments are numbered with, for example, "first," "second," the ordinal numbers do not imply priorities of the embodiments. Many other variations and modifications will be apparent to those skilled in the art.

All examples and conditional language recited herein are intended for pedagogical purposes to aid the reader in understanding the invention and the concepts contributed by the inventor to furthering the art, and are to be construed as being without limitation to such specifically recited examples and conditions, nor does the organization of such examples in the specification relate to a showing of the superiority and inferiority of the invention. Although the embodiments of the present invention have been described in detail, it should be understood that the various changes, substitutions, and alterations could be made hereto without departing from the spirit and scope of the invention.

What is claimed is:

1. A wiring board comprising:
    an insulator layer having a top surface;
    a wiring layer covered by the insulator layer; and
    a plurality of pads directly formed on the top surface of the insulator layer in a pad arrangement region on the top surface of the insulator layer,
    wherein the pad arrangement region includes a first region in which a first plurality of pads among the plurality of pads are arranged at a first density and electrically connect to the wiring layer, and a second region in which a second plurality of pads among the plurality of pads are arranged at a second density lower than the first density and electrically connect to the wiring layer,
    wherein at least one dummy pad is arranged juxtaposed to at least one of the second plurality of pads in the second region of the pad arrangement region, and
    wherein the at least one dummy pad does not contribute to an electrical connection.

2. The wiring board according to claim 1, wherein the at least one dummy pad is arranged outside the second region of the pad arrangement region, juxtaposed to the at least one of the second plurality of pads located at an outermost peripheral part of the second region, in a plan view viewed in a direction perpendicular to the top surface of the insulator layer.

3. The wiring board according to claim 1, further comprising:
    a plated layer formed on a surface of each of the plurality of pads,
    wherein the plated layer includes nickel.

4. The wiring board according to claim 1, wherein a plurality of dummy pads are arranged juxtaposed to the second plurality of pads of the second region, in a plan view viewed in a direction perpendicular to the top surface of the insulator layer, and at least a part of the second plurality of pads are arranged in a staggered pattern with the plurality of dummy pads.

5. The wiring board according to claim 2, wherein a distance between the at least one dummy pad and the one of the second plurality of pads located at an outermost peripheral part of the second region and nearest to the at least one dummy pad is shorter than a distance between two mutually adjacent second pads inside the second region.

6. The wiring board according to claim 1, wherein a plurality of dummy pads are arranged juxtaposed to the second plurality of pads of the second region, in a plan view viewed in a direction perpendicular to the top surface of the insulator layer, and the plurality of dummy pads are arranged at a pitch shorter than a pitch of mutually adjacent second pads inside the second region.

7. The wiring board according to claim 1, wherein a plurality of dummy pads are arranged juxtaposed to the second plurality of pads of the second region, in a plan view viewed in a direction perpendicular to the top surface of the insulator layer, and the plurality of dummy pads are located in at least one of a region outside the second region, a region at an outermost peripheral part inside the second region, and a region at an inner side of the outermost peripheral part inside the second region.

8. The wiring board according to claim 7, wherein the plurality of dummy pads are located in both the region at the outermost peripheral part inside the second region so that at least one of the plurality of dummy pads is arranged between two of the second plurality of pads in the region at the outermost peripheral part inside the second region, and the region at the inner side of the outermost peripheral part inside the second region so that at least one of the plurality of dummy pads is arranged between two of the second plurality of pads in the region at the inner side of the outermost peripheral part inside the second region.

9. The wiring board according to claim 1, wherein the at least one dummy pad has a pattern that is elongated along one side of the second region, juxtaposed to the second plurality of pads located at an outermost peripheral part along the one side of the second region, in a plan view viewed in a direction perpendicular to the top surface of the insulator layer.

10. The wiring board according to claim 1, wherein a plurality of columns of dummy pads are arranged outside the second region, juxtaposed to the second plurality of pads located at an outermost peripheral part of the second region, in the plan view viewed in a direction perpendicular to the top surface of the insulator layer.

11. A semiconductor device comprising:
a wiring board including
an insulator layer having a top surface, and
a plurality of pads arranged in a pad arrangement region on the top surface of the insulator layer,
wherein the pad arrangement region includes a first region in which a first plurality of pads among the plurality of pads are arranged at a first density, and a second region in which a second plurality of pads among the plurality of pads are arranged at a second density lower than the first density, and
wherein at least one dummy pad is arranged juxtaposed to at least one of the second plurality of pads in the second region of the pad arrangement region;
a semiconductor chip electrically connected to the plurality of pads of the wiring board; and
a resin provided between the wiring board and the semiconductor chip,
wherein the resin covers the at least one dummy pad, and
wherein the at least one dummy pad is electrically insulated from the semiconductor chip.

12. The semiconductor device according to claim 11, wherein the at least one dummy pad of the wiring board is arranged outside the second region of the pad arrangement region, juxtaposed to at least one of the second plurality of pads located at an outermost peripheral part of the second region, in a plan view viewed in a direction perpendicular to the top surface of the insulator layer.

13. The semiconductor device according to claim 11, wherein the wiring board further includes
a plated layer, including nickel, and formed on a surface of each of the plurality of pads.

14. The semiconductor device according to claim 11, wherein the wiring board includes a plurality of dummy pads arranged juxtaposed to the second plurality of pads of the second region, in a plan view viewed in a direction perpendicular to the top surface of the insulator layer, and at least a part of the second plurality of pads are arranged in a staggered pattern with the plurality of dummy pads.

15. The semiconductor device according to claim 12, wherein a distance between the at least one dummy pad and one of the second plurality of pads located at an outermost peripheral part of the second region and nearest to the at least one dummy pad is shorter than a distance between two mutually adjacent second pads inside the second region.

16. The semiconductor device as claimed in claim 11, wherein the wiring board includes a plurality of dummy pads arranged juxtaposed to the second plurality of pads of the second region, in a plan view viewed in a direction perpendicular to the top surface of the insulator layer, and the plurality of dummy pads are arranged at a pitch shorter than a pitch of mutually adjacent second pads inside the second region.

17. The semiconductor device according to claim 11, wherein the wiring board includes a plurality of dummy pads arranged juxtaposed to the plurality of second pads of the second region, in a plan view viewed in a direction perpendicular to the top surface of the insulator layer, and the plurality of dummy pads are located in at least one of a region outside the second region, a region at an outermost peripheral part inside the second region, and a region at an inner side of the outermost peripheral part inside the second region.

18. The semiconductor device according to claim 17, wherein the plurality of dummy pads of the wiring board are located in both the region at the outermost peripheral part inside the second region so that at least one of the plurality of dummy pads is arranged between two of the second plurality of pads in the region at the outermost peripheral part inside the second region, and the region at the inner side of the outermost peripheral part inside the second region so that at least one of the plurality of dummy pads is arranged between two of the second plurality of pads in the region at the inner side of the outermost peripheral part inside the second region.

19. The semiconductor device according to claim 11, wherein the at least one dummy pad of the wiring board has a pattern that is elongated along one side of the second region, juxtaposed to the second plurality of pads located at an outermost peripheral part of the second region, in a plan view viewed in a direction perpendicular to the top surface of the insulator layer.

20. The semiconductor device according to claim 11, wherein a plurality of columns of dummy pads of the wiring board are arranged outside the second region, juxtaposed to the second plurality of pads located at an outermost peripheral part of the second region, in a plan view viewed in a direction perpendicular to the top surface of the insulator layer.

21. The wiring board as claimed in claim 1, wherein
the first plurality of pads electrically connect to the wiring layer through via holes in the insulator layer to provide external connection terminals for electrically connecting to a semiconductor chip,
the second plurality of pads electrically connect to the wiring layer through via holes in the insulator layer to provide external connection terminals for electrically connecting to the semiconductor chip,
a plurality of dummy pads are directly formed on the top surface of the insulator layer and does not contribute to an electrical connection, and
the plurality of dummy pads include at least one first dummy pad arranged outside the pad arrangement region and juxtaposed to at least one of the second plurality of pads in the second region of the pad arrangement region.

\* \* \* \* \*